United States Patent [19]
Katchmar

[11] Patent Number: 5,796,582
[45] Date of Patent: Aug. 18, 1998

[54] PRINTED CIRCUIT BOARD AND HEAT SINK ARRANGEMENT

[75] Inventor: Roman Katchmar, Ottawa, Canada

[73] Assignee: Northern Telecom Limited, Montreal, Canada

[21] Appl. No.: 755,429

[22] Filed: Nov. 21, 1996

[51] Int. Cl.⁶ ........................... H05K 7/20

[52] U.S. Cl. ............ 361/704; 165/80.3; 165/185; 174/16.3; 257/712; 257/718; 257/719; 361/719; 361/720

[58] Field of Search .............. 165/80.2, 80.3, 165/185; 174/16.3, 252, 259; 257/706, 707, 713, 717–719, 722, 726, 727; 361/704–722, 767, 773

[56] References Cited

U.S. PATENT DOCUMENTS

| | | | |
|---|---|---|---|
| 5,646,826 | 7/1997 | Katchmar | 361/704 |
| 5,661,902 | 9/1997 | Katchmar | 361/719 |

*Primary Examiner*—Gregory D. Thompson
*Attorney, Agent, or Firm*—R. J. Austin

[57] ABSTRACT

Making an assembly of a printed circuit board structure and heat sink structure by locating a thermally conductive surface release agent upon a side of one of the structures and causing a flowable thermally conductive material to flow through a hole in the heat sink and lie between the release agent and the other structure. The thermally conductive material lies in heat conductive contact with the release agent and with the other structure and in alignment with an electronic component which is to be cooled upon the board. The release agent ensures easy release of the printed circuit board structure from the heat sink structure for disassembly purposes. An assembly of the two structures is also covered.

10 Claims, 2 Drawing Sheets

PRINTED CIRCUIT BOARD AND HEAT SINK ARRANGEMENT

This invention relates to printed circuit board and heat sink arrangements.

In structures of printed circuit boards carrying electronic components, heat is generated by the components in use and it is necessary to remove this heat so as to prevent overheating which could result in breakdown of one or more of the components. To remove the heat, heat sinks are conventionally used. For efficient heat exchange to occur, it has sometimes been deemed necessary for a heat sink to be intimately attached directly to a printed circuit board. However, this raises a problem in that it may be required to dismantle a printed circuit board and heat sink assembly for inspection, modification, or repair purposes and separation of the board from the heat sink may be virtually impossible without attendant destruction to one or more parts of the assembly.

In other suggested structures, heat sinks may be located on the same side of a printed circuit board as the electronic components so that the components lie between the board and the heat sink. Heat is transferred to the heat sink by a heat transfer medium compound from the electronic components. Again, there is the problem of disassembly of the parts should this be required for any reason. Further, if the compound is applied into position before assembly of the parts, this may not result in a satisfactory thermal connection between adjacent surfaces for promoting heat conduction. This latter method of assembly also is laborious and time consuming. Examples of this type of structure are to be found in U.S. Pat. Nos. 4,849,856 and 4,914,551.

In other structures, compressible thermally conductive pads are used to provide conductive bridges into heat sinks. Unfortunately, variations in gaps exist and which are bridged by these pads. Hence, if pads are used of substantially the same thickness then the gap variations lead to differences in compression of the pads and result in differences in thermal conductivity of the pads. As a result, control in rate of heat removal is almost impossible to obtain. Also, there is danger that overcompression of pads could result in strains in structures and solder joint breakage. Alternatively, to this, because of the variations in the gaps, pads of different thicknesses could in theory be used. However, for such difference thickness pads to be effective, then in each case the width of the gap must be closely ascertained and the corresponding size of pad placed in position to obtain the required compression to provide the desired thermal conductivity. As may be realized, this alternative method of providing pads of different thicknesses is impractical in that it is time consuming in determining the size of the gaps and also is impractical in the cost and problems associated with having pads of different thicknesses.

In U.S. Pat. No. 5,467,251, granted Nov. 14, 1995 in the name of R. Katchmar, there is described a structure in which heat is dissipated throughout a printed circuit board from electronic components mounted upon the board, the heat then being removed by bridging members extending to a heat sink from the board. In this arrangement, electronic components are bonded to the printed circuit board by a thermally conductive component which has been caused to flow into spaces between the component and the heat sink, the thermally conductive component then setting in position.

As a further development, U.S. patent application Ser. No. 08/601,671, now U.S. Pat. No. 5,646,828 describes a method of making a printed circuit board structure and heat sink structure assembly in which a heat sink is provided with a hole which is directed towards an electronic component when a printed circuit board carrying the component (to form the printed circuit board structure) is assembled to the heat sink structure. A heat conductive path is then created between the heat sink structure and the printed circuit board structure by causing a flowable thermally conductive material or compound to flow through the hole so as to occupy a spatial region between and in heat conductive contact with the heat sink structure and the printed circuit board structure. In certain constructions produced by the method of Katchmar 3, the heat sinks are removable and replaceable if required.

The present invention seeks to provide a method and a resultant structure concerned with a new assembly aspect.

According to the present invention there is provided a method of making an assembly of a printed circuit board structure and a heat sink structure comprising:—providing a printed circuit board structure comprising a printed circuit board and an electronic component mounted upon a first side of the printed circuit board; providing a heat sink structure with a hole defined through the heat sink structure; disposing a thermally conductive surface release agent upon a first side of a selected one of the two structures; relatively disposing the printed circuit board structure and the heat sink structure with the first sides of the two structures facing towards and spaced from each other and with the hole having its axis extending in a direction generally towards the electronic component; and creating a heat conductive path from the heat sink structure to the printed circuit board structure by causing a flowable thermally conductive material or compound to flow through the hole so as to occupy and be caused to remain in a spatial region:—a) between and in heat conductive contact with the thermally conductive surface release agent on one side of the spatial region and with the structure disposed on the other side of the spatial region; and b) in alignment with the electronic component.

The thermally conductive surface release agent which allows for release of one structure from the other may be any agent suitable for the purpose. However, in a preferred method the thermally conductive surface release agent comprises a tape having a surface release feature on a first side. A second side of the tape is heat conductively secured to the first side of the selected structure before the flowable thermally conductive material is caused to occupy and remain within the spatial area to cause the thermally conductive material to remain within the spatial region, it hardens then lies in intimate thermal conducting engagement with the surface release feature of the tape which being substantially non-secured thereto. In a practical structure, the tape needs to be of laminate structure. This laminate structure is provided by one layer to provide the surface release feature, i.e. a material which will not tend to adhere to the thermally conductive material. Such a material for this layer of the laminate structure is a thin film of polytetrafluoroethylene (PTFE) or fluorinated ethylene propylene. The tape may also need to have heat conductive properties from side-to-side and for this purpose the polytetrafluoroethylene or fluorinated ethylene propylene layer must be carried upon a heat conductive substrate. Such a substrate is conveniently formed from metal and this may be aluminum which is convenient for practical and economic reasons. However, other materials such as copper may be used for this layer.

Alternatively, the thermally conductive surface release agent is provided by coating the first side of the selected structure with a release agent in the form of a flowing and settable release material such as a hot coating of PTFE. Alternatively, a spray coating of a release agent may be all that is required. With the release agent in a set condition, the flowable thermally conductive material is caused to flow through the hole provided for injection purposes so as to occupy and remain in the spatial region. The thermally conductive material after hardening at least to the required degree then intimately contacts the release agent while not being secured thereto or while having a weak frangible bond therewith. With the latter method, the release agent is preferably coated only on selected or desired areas of the first side of the selected structure. This is conveniently performed by masking other areas of the first side which do not require the use of the release agent. Masking need not be required in which case, the release agent is applied all over the first side of the selected structure.

Various thermally conductive materials or compounds which are suitable are known in the art of thermal management of electronics device power. As an example, and as described in U.S. patent application Ser. No. 08/601,671, a suitable material is an admixture of a silicon based resin and thermally conductive particles (e.g. boron nitride particles). The percentage of the particles in the admixture influences the thermal conductive properties of the admixture. Such an admixture may be caused to flow to achieve the method of the invention for a specific time period after formulation of the resin and may, dependent upon the specific resin mix, be curable into a set condition either at room temperature or at an elevated temperature not sufficiently high to damage components, e.g. in the region of 60° C. to 80° C. or even higher. A suitable viscosity modifier may be required to curtail slump characteristics of the uncured compound. An alternative suitable material employs an epoxy based resin in admixture with thermally conductive particles, e.g. boron nitride. Optimum thermal performance can be attained with certain metal alloys with sufficiently low melting points, such as indium/tin alloys which may have melting points at 118° C. or lower. However, when using metal alloys which have electrically conductive properties, control of the dispensing process is critical to ensure that none of the alloy material flows beyond its required position in the spatial region so that the alloy material does not cause shorting of electrical or electronic components.

With the use of the method of the invention, the printed circuit board and heat sink structures are assembled together into their relative positions before the thermally conductive material or compound flows into position. Because the thermally conductive material or compound is caused to flow between the two structures subsequent to their assembly together, then the flowing material intimately contacts both the thermally conductive surface release agent and the structure disposed on the other side of the spatial region thereby maximizing the thermal conductive efficiency of the assembly. In addition, it is convenient to manufacture the assembly by the above method because the thermally conductive material is not positioned upon one of the structures before the other structure is located in position and thus any slow and messy assembly steps are avoided. In contrast, because the flowable material is caused to flow through a hole in the heat sink structure then the method is particularly suitable for use with injection apparatus, i.e. by location of an injection nozzle into the hole for injection of the material between the two structures. Hence, the process step of locating the thermally conductive material in its correct position is easily, quickly, efficiently and cleanly accomplished. The resultant assembly of the printed circuit board and heat sink structures optimizes heat removal from components mounted upon a printed circuit board and is thus particularly relevant to removal of heat from printed circuit board structures in which the heat generated could result in electronic component failure from malfunction if not conducted away with suitable efficiency. All of these advantages in manufacture and in use are obtained with the thermally conductive surface release agent located in position and in thermal conductive engagement on either one or both of its two sides with the selected structure and with the thermally conductive material or compound. Although thermal conductive pathways are produced between the electronic components and the heat sink, nevertheless the surface release agent enables the two structures to be dismantled one from the other for disassembly purposes.

In the method according to the invention defined above the first side of the printed board structure may be the side at which is located the electronic component. In this case it may be that the electronic component surface itself provides the first side of the printed circuit board structure against which the release agent is located. Hence, in this structure, the electronic component is connected to the heat sink for thermal conduction purposes firstly through the thermally conductive release agent then through the thermally conductive material or compound and into the heat sink itself. Alternatively, with the electronic component disposed on a second side of the printed circuit board structure then the thermally conductive surface release agent may be provided upon the printed circuit board itself which provides the first side of that structure. Of course the release agent may be disposed instead upon the first side of the heat sink structure.

Embodiments of the invention will now be described, by way of example, with reference to the accompanying drawings, in which.

Figure 1:
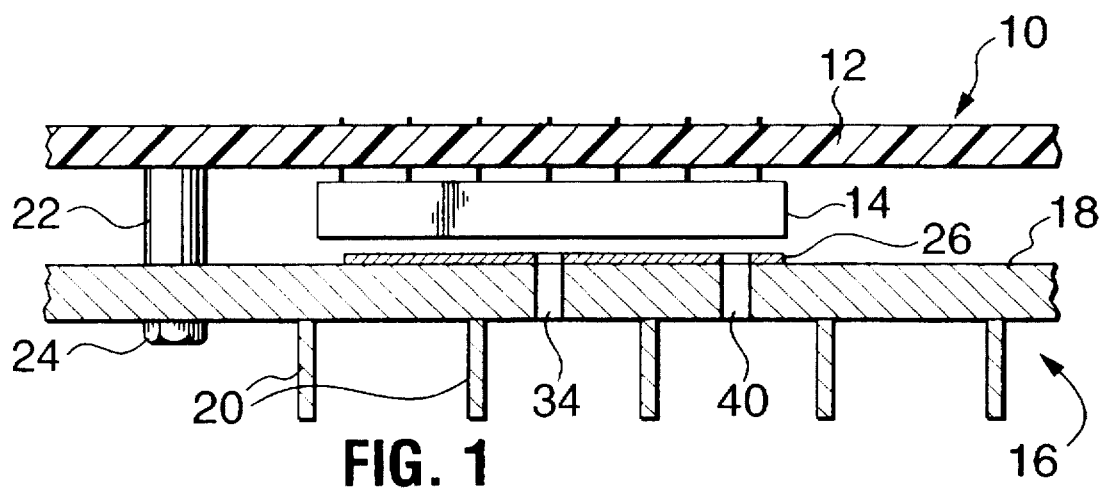
FIG. 1 is a cross-sectional view through a printed circuit board structure and heat sink structure at one stage during their assembly and according to a first embodiment.

In a first embodiment as shown by FIG. 1, a printed circuit board structure 10 comprises a printed circuit board 12 having a plurality of electronic components 14 mounted upon one side of the board (only one component 14 being shown). For removal of heat from the printed circuit board structure during use a heat sink structure 16 is provided. This heat sink structure comprises a planar body 18 from one side of which a plurality of parallel and spaced apart heat cooling fins 20 extend. The two structures 10 and 16 are detachably secured together, by mechanical attachment means not shown, with the fins 20 directed outwardly from the side of the planar body 18 remote from the printed circuit board structure 10. Also, in the assembly the components 14 are located upon the board between the two structures and with the distances between the components and the planar body 18 of the heat sink being dependent upon the sizes of the components and varying from one component to another. The structures 10 and 16 are maintained in fixed spaced-apart relationship by spacer columns 22 (one being shown) which are held in position by bolts or securing screws 24 extending either through the planar body 18 of the heat sink as shown or through the printed circuit board 12.

Figure 2:
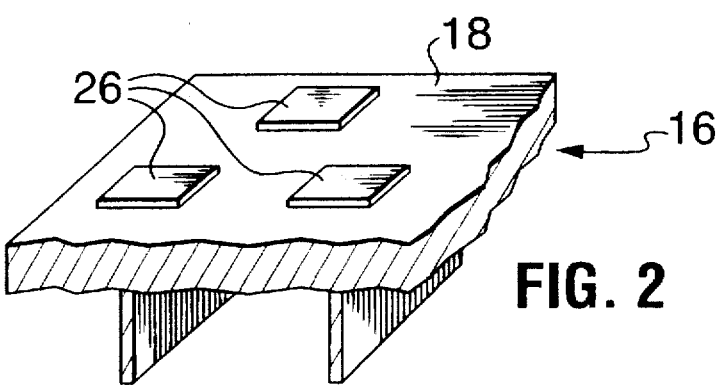
FIG. 2 is an isometric view of part of the heat sink structure of the assembly of the first embodiment.
Figure 2A:
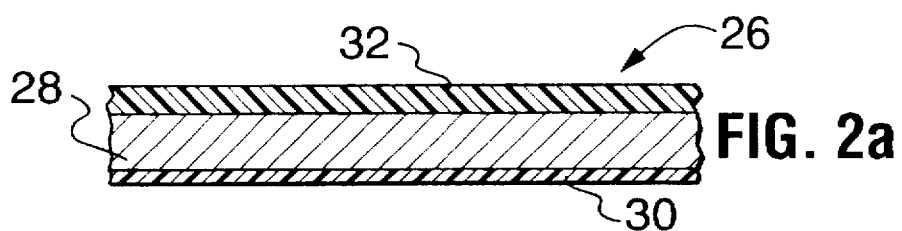
FIG. 2a is a cross-sectional view through part of the structure of the first embodiment and to a larger scale.

Before assembly of the two structures 10 and 16 together, the heat sink 16 is provided with a thermally conductive surface release agent at selective positions to enable subsequent disassembly of the two structures 10 and 16 after their final assembly and without causing damage to any part of the structures. As shown by FIG. 2, the release agent is disposed so as to cover and adhere to the unfinished surface of the planar body 18 in discrete areas which are directly opposed to the positions of the electronic components 14 upon assembly. Hence, in this embodiment, the thermally conductive release agent comprises a plurality of short lengths 26 of thermally conductive tape which are disposed in the required positions. As shown by FIG. 2a, which is a cross-section through a typical length 26 of tape, each length of tape comprises a basic substrate layer 28 which is aluminum foil approximately 2 mil thick. On the one side of the foil is provided a layer 30 of a thin acrylic based pressure sensitive adhesive which may be of any required thickness, but in this case is 0.5 mil thick. Any other suitable adhesive may be used. On the other side of the layer 28 is a layer 32 of fluorinated ethylene propylene or polytetrafluoroethylene which provides a surface release feature as will be described. The thickness of the layer 32 need only be in the region of 1 mil. Hence, each length 26 is composed of thermally conductive materials. Each tape 26 is positioned exactly in its required location with the acrylic layer 30 securing the length 26 to the planar body 18 of the heat sink structure.

Figure 3:
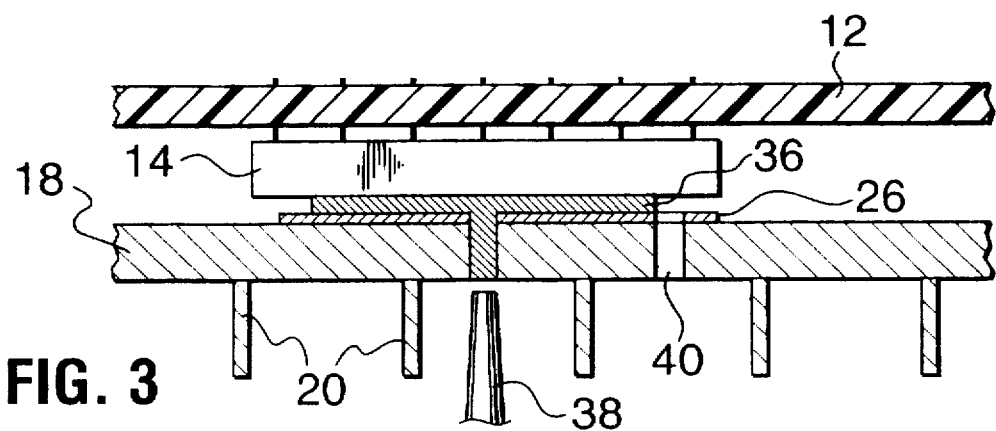
FIG. 3 is a view similar to FIG. 1 of a subsequent stage in the manufacture of the assembly of the first embodiment.

After assembly of the structures 10 and 16 as shown in FIG. 1 and as described above, it is necessary to thermally conductively connect the structures 10 and 16 together for removal of heat from the structure 10 out through the heat sink structure. This is effected by injecting a thermally conductive and at least partially settable flowing material or compound through a hole 34 provided in the planar body 18 in respect of each of the components 14. Each hole 34 extends through a tape length 26. If, each tape length symmetrically or centrally positioned relative to its respective electronic component, it is preferable to have its hole 34 positioned substantially centrally with regard to its tape length. Of course, the tape length may be offset relative to its component in which case the hole 34 may be central with the tape. To inject the thermally conductive material 36 through the hole 34, an injection nozzle 38 (FIG. 3) is disposed into the opening of the hole 34 and a mass of the material 36 is injected through the hole so as to flow into and expand progressively across a spatial region between the component 14 and the corresponding tape length 26. Care needs to be taken to ensure that the thermally conductive material is not excessively applied in each case. For this purpose, an observation aperture 40 is provided in the planar body 18 with respect to each component 14. The observation aperture 40 is spaced from a respective hole 34 a distance which needs to be determined to ensure that only sufficient of the thermally conductive material has been injected into position. The observation aperture must also be provided within the bounds of the tape length 26 to ensure that the thermally conductive material 36 does not extend beyond the edges of the tape length and into contact with the planar body 18. The latter may set up permanent and undesirable adhesive contact with the planar body 18 which is against the teachings of the present invention. Also, because the material 36 is likely to flow at substantially the same rate in all directions away from the hole 34, it is prudent to have all of the tape lengths 26 of substantially square configuration as shown in FIG. 2 and with the hole 34 positioned as centrally as possible and as shown by that Figure. Where the hole 34 is not centrally positioned either with regard to its tape or with regard to its electronic component, extreme care must be taken to prevent contact between the material 36 and the planar body 18.

It follows therefore that as injection of the material 36 proceeds through the nozzle 38, then as soon as the material is seen by observation through the aperture 40, then no more of the material should be injected for that particular component 14. The material 36 is then allowed to set or harden in position thereby providing a heat conductive bridge between each of the components 14 and the heat sink structure 16 through a tape length 26.

The thermally conductive material 36 may be of any suitable material having the required thermal properties and which will intimately contact the surfaces against which it has been injected. Such a material is as described in the earlier application (Katchmar 3) and is of material having viscous properties and possibly also adhesive properties to be disposed within the spatial region between each component and a tape length 26. The material may have a low modulus of elasticity preferably well below 5000 lbs. per square in., although certain exceptions may permit moduli much greater than this. The material 36 is an admixture of a silicon based resin and boron nitride particles. The quantity of the particles, in percentage by weight of the total admixture, controls the thermally conductive properties of the admixture which may thus be as desired. For the purpose of disposing the thermally conductive medium within each space, the material may be injected at room temperature through each of the holes 34 from the outside of the heat sink. The thermally conductive material is then cured either at room temperature or at around 60° C. to 80° C. which should have no disadvantageous effects upon the circuitry for the components of the printed circuit board structure.

Figure 4:
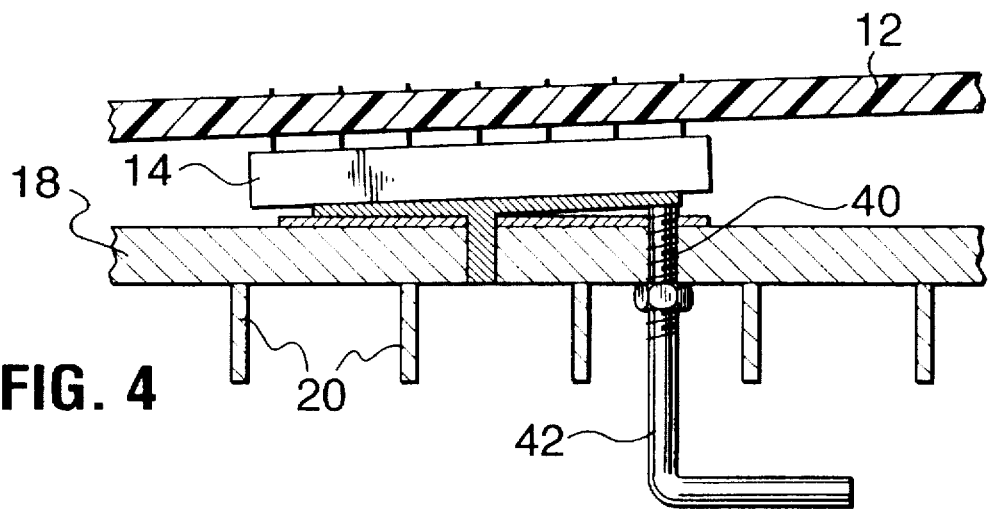
FIG. 4 is a view similar to FIG. 3 and showing the manner of removal of the heat sink structure from the printed circuit board structure.

To disassemble the two structures 10 and 16 after loosening or removal of the mechanical attachment means, it is possible to use each of the observation apertures 40 or perhaps only selective ones of these apertures. For this purpose, a disassembly tool may be inserted through the required apertures 40 to be pushed with care against either a component 14 or against the printed circuit board 12. Any slight adherence between each mass of material 36 and a tape length 26 is overcome thereby forming a line of severance at the interface between these two elements and forcing the heat sink away from the printed circuit board structure. As indicated, this may need to be performed at various locations across the facial area of the heat sink for the full effect of the disassembly operation to be realized. For total control in applying load at each selected location, it is desirable for each observation aperture 40 to be screw-threaded as shown by FIG. 4 and the disassembly tool 42 is complementarily screw-threaded for reception within the hole. As may be realized, screwing of the tool into position gradually moves it axially so as to gradually and progressively increase the load applied against a component 14 or again the printed circuit board 12 until separation occurs between a mass of material 36 and its respective tape length 26. FIG. 4 shows the relative positions of the structures 10 and 16 as they begin to move apart during disassembly.

As may be seen therefore in the first embodiment of the invention provides a process and a structure for bridging gaps between electronic components mounted on a board and a heat sink in which these gaps may vary from component-to-component and without applying any undue strain or stresses upon any of the elements of the two structures. Furthermore, the invention enables complete and clean separation between the two structures without harming or breaking any of the elements of the structures. Apart from providing an extremely efficient heat exchange arrangement therefore for use in printed circuit boards, an extremely clean and efficient method is provided for disassembly for maintenance purposes.

Figure 5:
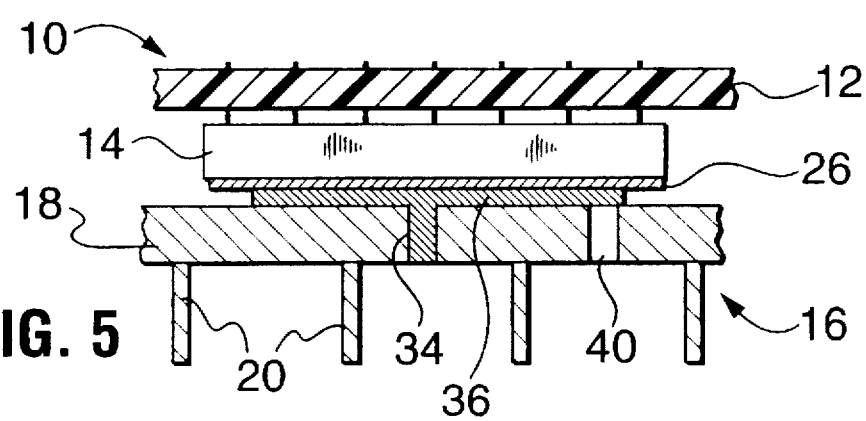
FIGS. 5 and 6 are views similar to FIG. 3 of respectively, second and third embodiments.

In the invention, it is not essential for the release agent to be applied to the heat sink structure 16 nor is it necessary for the agent to comprise a tape length as discussed above. For instance, as shown by FIG. 5, in a total assembly which is similar to that described in the first embodiment and in which parts bearing the same reference numerals are similar or identical, a tape length 26 in each case is attached to an electronic component 14 instead of to the heat sink 16. Thus upon separation of this structure, as shown in FIG. 5 the heat sink 16 is removed together with the masses of material 36 and the tape lengths 26 remain carried upon the components 14.

Figure 6:
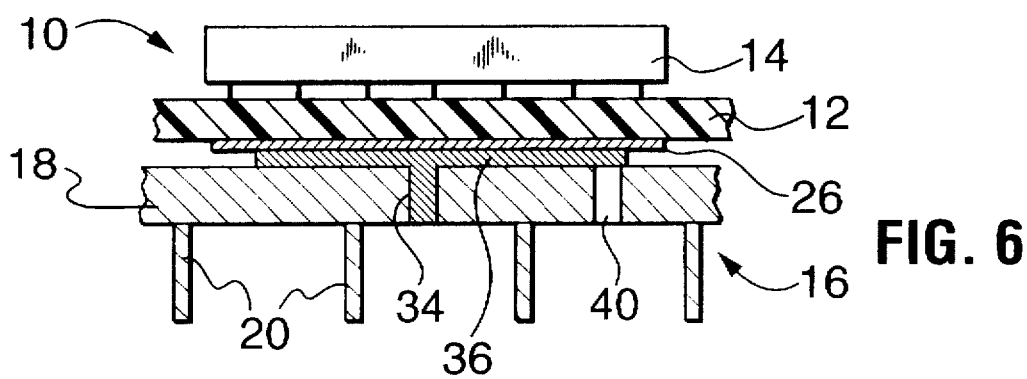

In a third embodiment as shown by FIG. 6, with the structure having similar parts to that shown in the first embodiment, a printed circuit board structure 10 is positioned upon the heat sink 16 with the components 14 on the other side of the printed circuit board. With this arrangement the tape length 26 in each case may be positioned upon the planar body 18, as in the first embodiment or as shown in FIG. 6. Each tape length is actually applied to a surface of the printed circuit board 12 which faces the heat sink 16. In the latter case, care should be taken to ensure that each of the tape lengths does not extend into contact with an electric conductor upon the surface of the board as electrical conductivity properties of the tape length could disastrously affect the desired operation of the circuitry.

Figure 7:
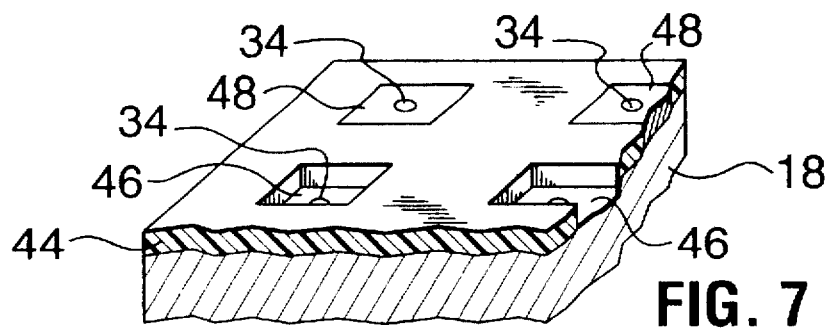
FIG. 7 is a view similar to FIG. 2 of part of the heat sink structure of an assembly according to a fourth embodiment.

In a fourth embodiment, a release tape length 26 or any other release tape is not used. As shown by FIG. 7, the unfinned surface of the planar body 18 of the heat sink is provided with a mask 44 except in areas provided by windows 46 in the mask. In these areas, a release agent is provided selectively by filling the windows with a coating material having suitable thermally conductive properties. Such a suitable release agent is a flowable settable release material which sets either after cooling or with heat treatment accompanied by a curing action. A suitable material for this function is provided by Teflon which is heated to render it flowable. The Teflon is then caused to fill each of the windows 46 to form release agent pads 48 as shown in FIG. 7 and which are thermally conductively in intimate contact with the heat sink 16.

As an alternative to the fourth embodiment, no mask 44 is used and the entire unfinned surface of the planar body 18 is coated with release agents.

What is claimed is:

1. A method of making an assembly of a printed circuit board structure and heat sink structure comprising:
    providing a printed circuit board structure comprising a printed circuit board and an electronic component mounted upon a first side of the printed circuit board;
    providing a heat sink structure with a hole defined through the heat sink structure;
    disposing a thermally conductive surface release agent upon a first side of a selected one of the structures;
    relatively disposing the printed circuit board structure and the heat sink structure with the first sides of the two structures facing towards and spaced from each other and with the hole having its axis extending in a direction generally towards the electronic component;
    and creating a heat conductive path from the heat sink structure to the printed circuit board structure by causing a flowable thermally conductive material or compound to flow through the hole so as to occupy and be caused to remain in a spatial region:
    a) between and in heat conductive contact with the thermally conductive surface release agent on one side of the spatial region and in thermally conductive contact with the structure disposed on the other side of the spatial region; and
    b) in alignment with the electronic component.

2. A method according to claim 1 wherein the thermally conductive release agent comprises a tape having a surface release feature on a first side of the tape, and the release agent is provided by heat conductively securing a second side of the tape to the first side of the selected structure, and subsequently causing the flowable thermally conductive material to occupy and remain within the spatial region, the conductive material after hardening intimately contact the release feature while being capable of being physically separated therefrom by the application of a separation force.

3. A method according to claim 1 comprising providing the release agent by coating the first side of the selected structure with a flowing settable release material and with the release material in a set condition, causing the flowable thermally conductive material to flow through the hole so as to occupy and remain in the spatial region, the thermally conductive material after at least partially hardening intimately contacting the set release material while being capable of being physically separated therefrom by the application of a separating force.

4. A method according to claim 3 wherein the release material is coated onto the first side of the selected structure only upon desired areas of the first side.

5. A method according to claim 1 further comprising providing a disassembly aperture in the heat sink in a positioned spaced from the hole, the disassembly aperture located for insertion of a tool to engage the printed circuit board structure to enable the printed circuit board structure and the heat sink structure to be urged apart during which the thermally conductive material becomes removed from the release agent.

6. A printed circuit board structure and heat sink structure assembly comprising:
    a structure of printed circuit board and an electronic component detachably mounted upon the printed circuit board;
    a heat sink structure with a hole defined through the heat sink structure for injection purposes;
    the two structures disposed with first sides of the structures face-to-face and spaced-apart with the hole extending in a direction generally towards the electronic component;
    and thermally conductive material that has flowed through the hole to be disposed between the two structures and occupy a spatial region extending across the hole to provide a heat conductive bridge between the two structures and in alignment with the electronic component, the thermally conductive material held away from a first side of a selected one of the structures by a thermally conductive surface release agent which is disposed in thermal conductive engagement both with the first side of the selected structure and with the thermally conductive material while being capable of being physically separated from the thermally conductive material by the application of a separating force.

7. An assembly according to claim 6 wherein the thermally conductive release agent comprises a tape having a surface release feature in contact with the thermally conductive material and the tape upon the other side is heat conductively secured to the first side of the selected one of the two structures.

8. An assembly according to claim 6 wherein the thermally conductive release agent is provided by a coating on the first side of the selected structure, the coating being in a set condition and lying on its two sides in intimate heat conductive relationship with the thermally conductive material and with the first side of the selected structure.

9. An assembly according to claim 8 wherein the release agent is provided as a coating only upon desired areas of the first side of the selected structure.

10. An assembly according to claim 6 further comprising a disassembly aperture in the heat sink in a position spaced from the hole, the disassembly aperture located for insertion of a tool to engage the printed circuit board structure so as to apply the separation force against the printed circuit board structure and urge the printed circuit board structure and the heat sink structure apart by separation of the thermally conductive material from the release agent.

* * * * *